(12) United States Patent
Wildner

(10) Patent No.: US 7,906,858 B2
(45) Date of Patent: Mar. 15, 2011

(54) CONTACT SECURING ELEMENT FOR BONDING A CONTACT WIRE AND FOR ESTABLISHING AN ELECTRICAL CONNECTION

(75) Inventor: Ingolf Wildner, Reutlingen (DE)

(73) Assignee: Robert Bosch GmbH, Stuttgart (DE)

( * ) Notice: Subject to any disclaimer, the term of this patent is extended or adjusted under 35 U.S.C. 154(b) by 648 days.

(21) Appl. No.: 11/436,794

(22) Filed: May 17, 2006

(65) Prior Publication Data
US 2006/0208038 A1 Sep. 21, 2006

Related U.S. Application Data

(60) Division of application No. 10/251,417, filed on Sep. 20, 2002, now Pat. No. 7,083,077, which is a continuation of application No. 09/701,224, filed as application No. PCT/DE99/01037 on Apr. 7, 1999, now Pat. No. 6,477,768.

(30) Foreign Application Priority Data

May 27, 1998 (DE) ................................ 198 23 623

(51) Int. Cl.
*H01L 29/41* (2006.01)
(52) U.S. Cl. ...................... 257/784; 257/780; 228/180.5
(58) Field of Classification Search .................. 257/778, 257/784, 780, 781; 174/84 R; 228/180.5
See application file for complete search history.

(56) References Cited

U.S. PATENT DOCUMENTS

| 3,373,481 | A | 3/1968 | Lins et al. |
| 3,623,649 | A | 11/1971 | Keisling |
| 4,415,115 | A | 11/1983 | James |
| 5,111,989 | A | 5/1992 | Holdgrafer et al. |
| 5,172,851 | A | 12/1992 | Matsushita et al. |
| 5,176,310 | A | 1/1993 | Akiyama et al. |
| 5,421,503 | A | 6/1995 | Perlberg et al. |
| 5,476,211 | A | 12/1995 | Khandros |
| 5,836,071 | A | 11/1998 | Falcone et al. |
| 5,852,871 | A | 12/1998 | Khandros |
| 5,960,262 | A | * | 9/1999 | Torres et al. ................. 438/123 |
| 6,079,610 | A | 6/2000 | Maeda et al. |
| 6,158,647 | A | 12/2000 | Chapman et al. |
| 6,270,000 | B1 | 8/2001 | Nishiura |
| 6,295,729 | B1 | 10/2001 | Beaman et al. |
| 6,316,838 | B1 | 11/2001 | Ozawa et al. |
| 6,715,666 | B2 | 4/2004 | Imai et al. |

FOREIGN PATENT DOCUMENTS

| JP | 57 012 530 | | 1/1982 |
| JP | 59 195 836 | | 11/1984 |
| JP | 61 280 626 | | 12/1986 |
| JP | 63 244 633 | | 10/1988 |
| JP | 63244633 A | * | 10/1988 |
| JP | 01 057 725 | | 3/1989 |
| JP | 01 158 742 | | 6/1989 |
| JP | 01 239 861 | | 9/1989 |
| JP | 01 276 729 | | 11/1989 |
| JP | 03 289 149 | | 12/1991 |
| JP | 08008284 A | * | 1/1996 |

* cited by examiner (Continued)

*Primary Examiner* — Victor A Mandala
*Assistant Examiner* — Scott Stowe
(74) *Attorney, Agent, or Firm* — Kenyon & Kenyon LLP

(57) ABSTRACT

A method for establishing an electrical connection between a first contact surface and a second contact surface, with a wire-bonding tool being used to provide a contact wire between the contact surfaces by bonding the contact wire to the first contact surface and subsequently leading it to the second contact surface, bonding it to the latter, and subsequently, separating it using the wire-bonding tool. After the contact wire has been separated from the second contact surface, the wire-bonding tool is used to provide the contact point with an additional contact securing element via the contact wire.

10 Claims, 13 Drawing Sheets

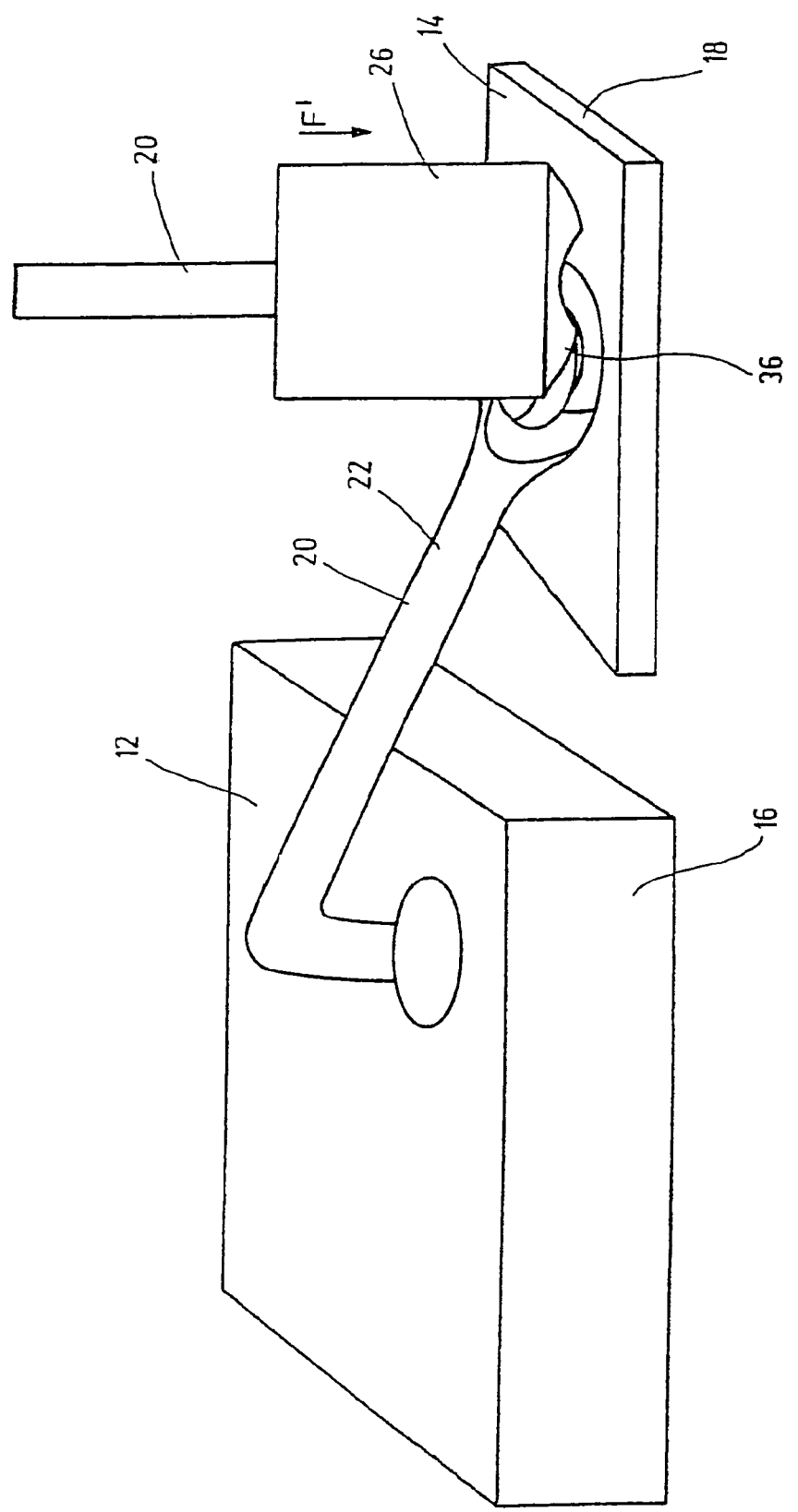

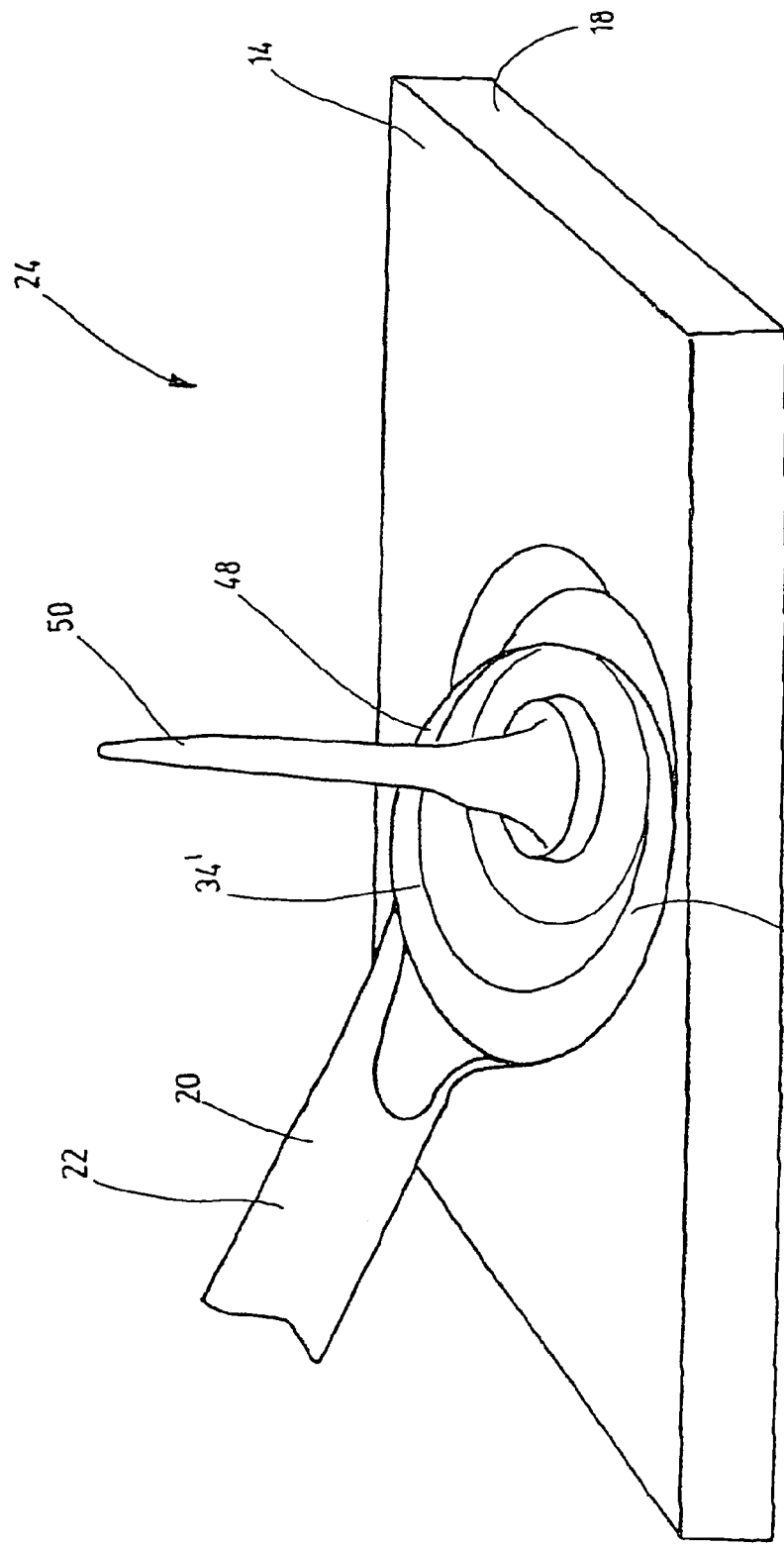

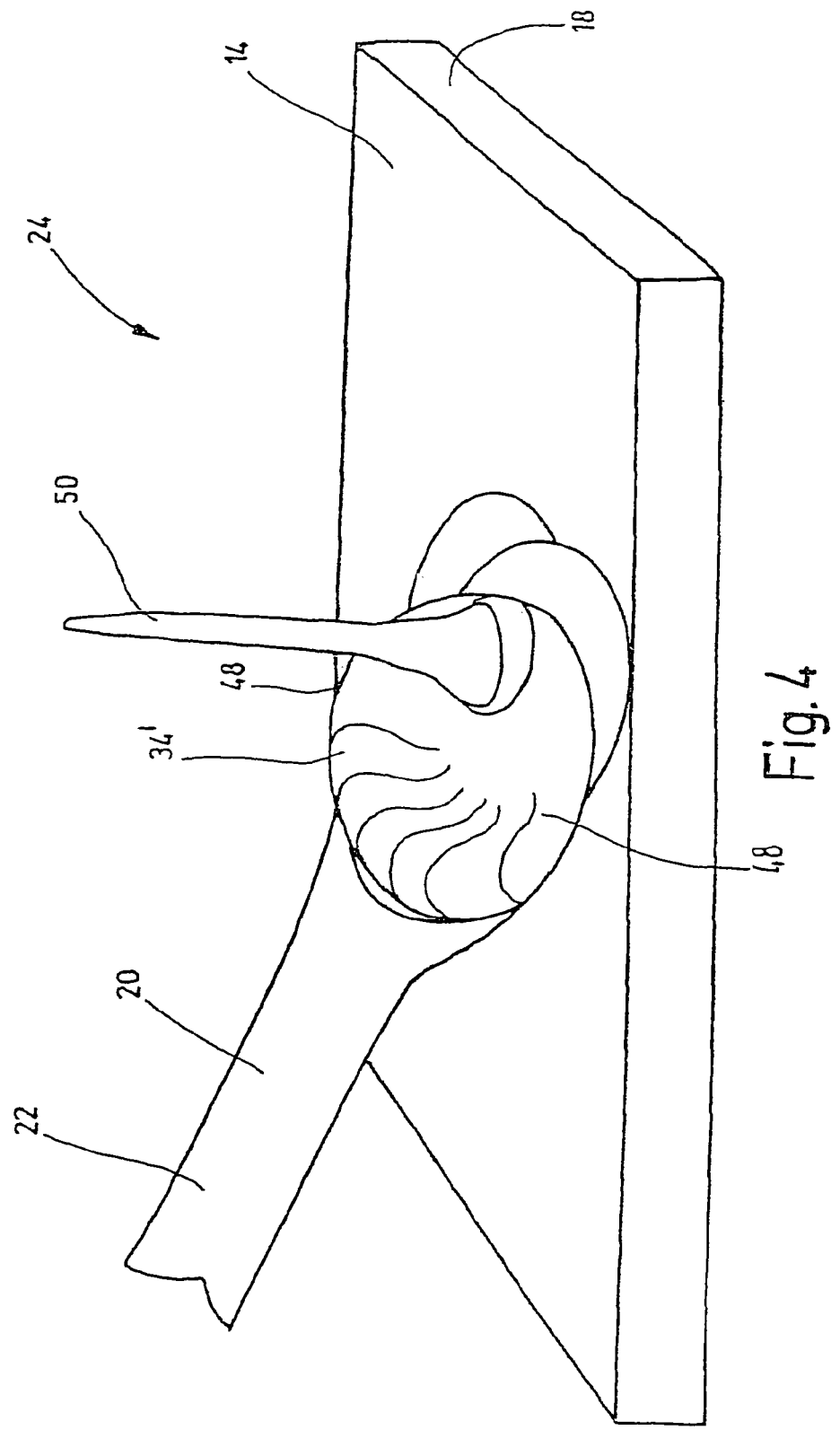

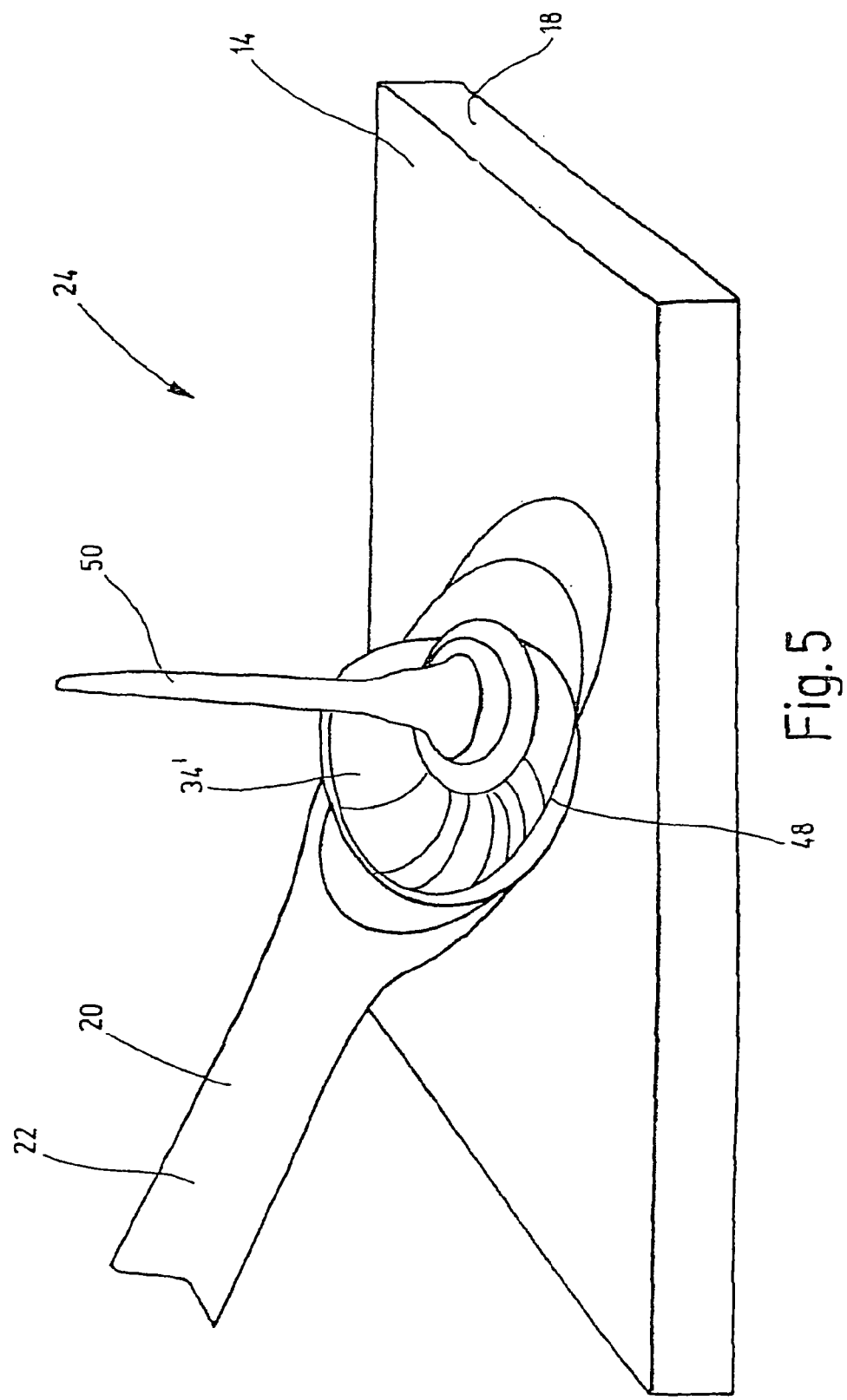

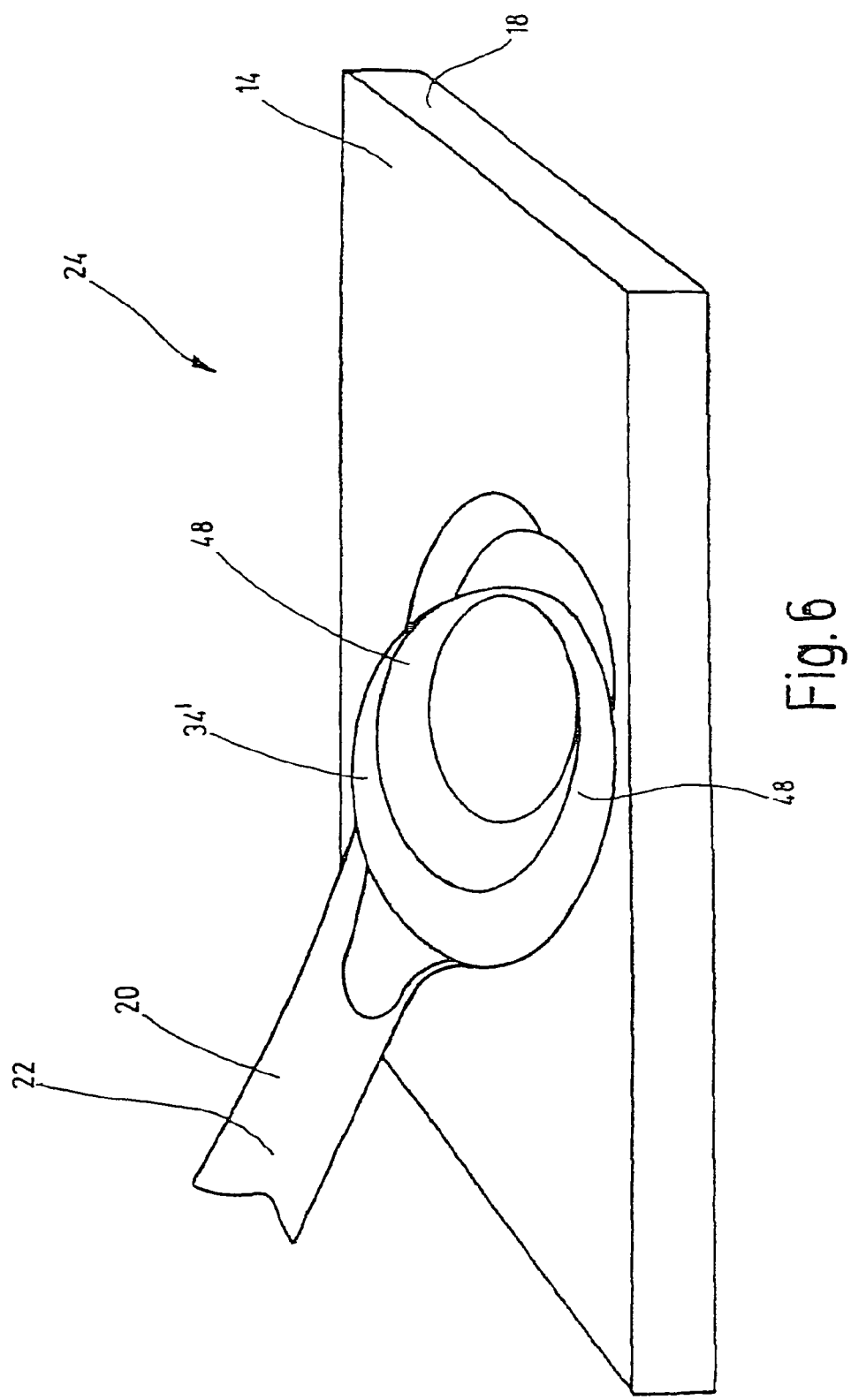

CONTACT SECURING ELEMENT FOR BONDING A CONTACT WIRE AND FOR ESTABLISHING AN ELECTRICAL CONNECTION

CROSS-REFERENCE TO RELATED APPLICATION

This application is a divisional of prior application Ser. No. 10/251,417 now U.S. Pat. No. 7,083,077 filed Sep. 20, 2002 which is a divisional of prior application Ser. No. 09/701,224 now U.S. Pat. No. 6,477,768 filed Mar. 12, 2001.

FIELD OF THE INVENTION

The present invention relates to a method for establishing an electrical connection, features and a contact point.

BACKGROUND INFORMATION

A single-wire contacting method, called bonding, is known for establishing an electrical connection between at least two contact surfaces. In doing this, individual wires, in particular, gold or aluminum wires, are positioned between the contact surfaces to be bonded, using a wire-bonding tool. In bonding, the contact wire is bonded to the contact surfaces by applying ultrasonic pressure and heat. The free end of the bonding wire is first melted to form a ball, by applying thermal energy, and subsequently pressed onto the first contact surface, using a bonding capillary. The contact wire bonds to the contact surface as a result of atomic bonding forces (material fusion) arising at the boundary between the contact surface and the contact wire. During bonding to the first contact surface, the ball that was previously melted on is deformed into a nail head. The contact wire is then led to the second contact surface, using the wire-bonding tool. To prevent the contact wire from breaking away at the first contact point, the contact wire is formed into a loop. The contact wire is then pressed onto the second contact surface with the wire-bonding tool by again applying ultrasonic pressure and heat. This produces necking of the contact wire, causing the latter to form a rupture joint at which the contact wire breaks away from the second contact surface as the wire-bonding tool moves on. The contact wire is bonded to the second contact surface by a "stitch," with atomic bonding forces again arising at the boundary between the contact wire and the second contact surface.

This known ball-wedge bonding method (ball bonding with the first contact surface, and stitch bonding with the second contact surface) produces a strong dependency between the materials of the contact wire and the contact surface, thus forming strong atomic bonding forces at the boundaries. Particularly when contacting the second contact surface, a relatively weak surface bonding forms between the stitch and the contact surface, resulting in contacting errors, particularly in the case of contact surfaces made of hard-to-bond materials.

SUMMARY OF THE INVENTION

The method according to the present invention offers an advantage over the related art in that it considerably improves the contact stability of the bond between the contact wire and the second contact surface. The fact that the wire-bonding tool provides the contact point with an additional contact securing element after bonding the second contact surface increases the contact stability of the second contact point (stitch or wedge) independently of the generation of atomic bonding force between the contact wire and the second contact surface.

In one preferred embodiment of the present invention, the additional contact securing element is provided by the ball shape, applied to the contact point and subsequently deformed by the bonding tool, at the end of the contact wire that remains free after contacting the second contact surface. This makes it possible, after forming the electrical connection between the contact wire and the second contact surface, to immediately form the ball on the end of the contact wire that is now free and to position it over the contact point as an additional contact securing element. A particularly preferred feature is to deform the ball with the wire-bonding tool so that the contact point overlaps, producing at least one, preferably two, additional bonding areas between the additional contact securing element and the contact surface. The atomic bonding forces generated cause the additional bonding areas to adhere to the contact surface, forming a sort of tensile strain relief for the contact wire bonded to the second contact surface. This very reliably prevents the contact wire from breaking away from the second contact surface. The possibility of the contact wire breaking away is now determined only by the rupture strength of the contact wire itself, and no longer by the adhesion between the contact wire and the second contact surface, i.e., the contact wire itself breaks before the contact point ruptures.

According to another preferred embodiment of the present invention, the production of the additional contact securing element can be precisely reproduced through wire-bonding tool settings, in particular, by programming a corresponding controller of the wire-bonding tool. This makes it possible to create identical contact securing elements among a large number of contacts, and these identical contact securing elements can be easily tested on the basis of a predictable, reproducible result. One particularly preferred feature is that a visual, preferably automatic visual, inspection of the contact point is carried out, in which the contact securing elements that are not precisely produced, i.e., according to the specified degree of reproducibility, are reliably detected. This makes it possible to achieve a sort of zero error rate in producing bonds that result in a higher production yield.

A contact point according to the present invention advantageously ensures a high contact stability between the contact wire and contact surface. Since the contact point includes an additional contact securing element which at least partially engages over the contact wire in the area of the contact point and forms at least one additional bonding surface with the contact surface, the available overall surface is advantageously increased for contacting the contact wire with the contact surface, enabling the contact point to withstand higher mechanical stresses. Particularly when used in safety-related components, this contact point can maintain highly redundant electrical connections.

BRIEF DESCRIPTION OF THE DRAWINGS

FIG. 1f shows a sixth schematic view of the process steps in establishing an electrical connection.

FIG. 3 shows a second embodiment of a contact point.

FIG. 4 shows a third embodiment of a contact point.

FIG. 5 shows a fourth embodiment of a contact point.

FIG. 6 shows a fifth embodiment of a contact point.

DETAILED DESCRIPTION

Figure 1A:
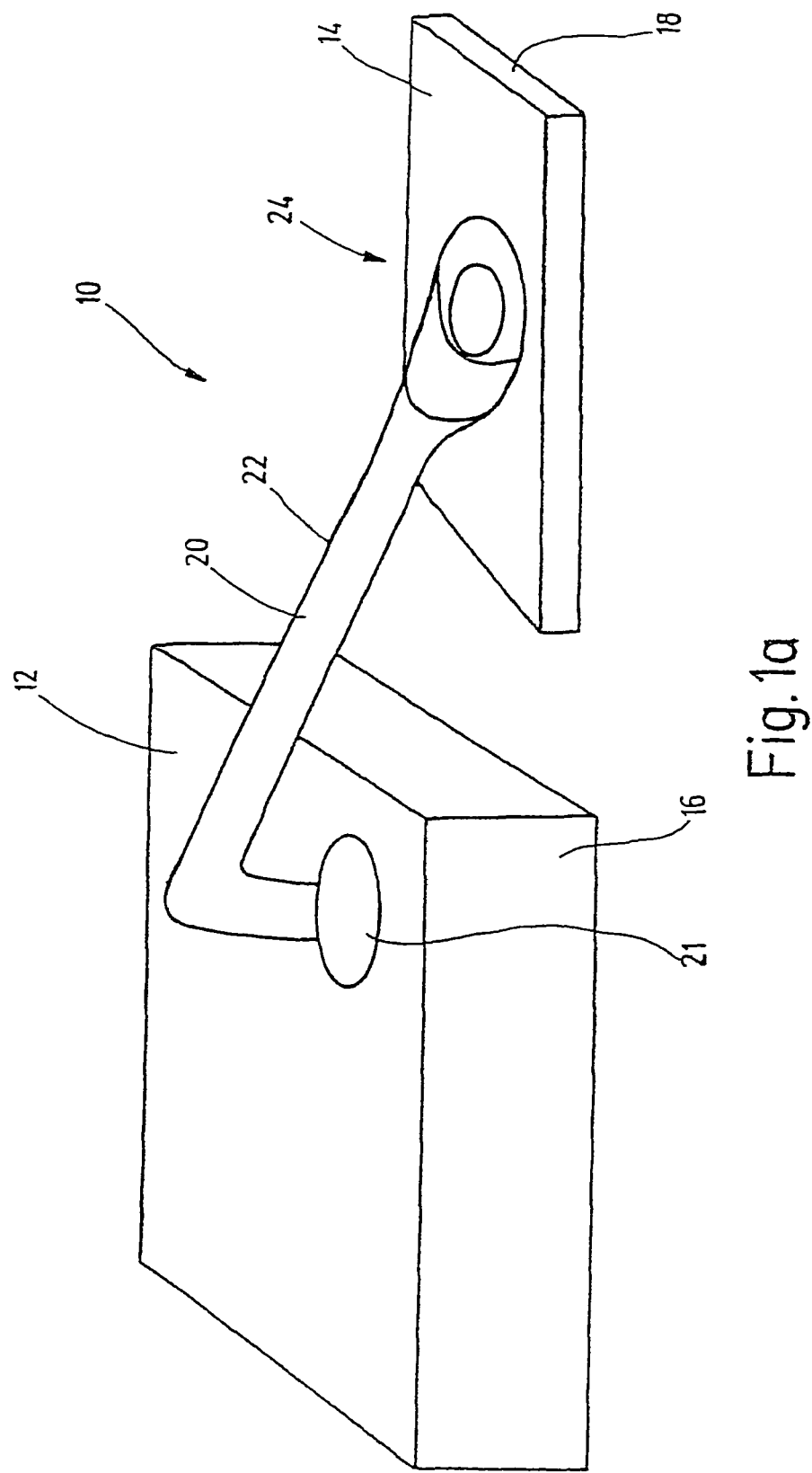
FIG. 1a shows a first schematic view of the process steps in establishing an electrical connection.

FIG. 1a shows an electrical connection 10 between a first contact surface 12 and a second contact surface 14. Contact surface 12 is provided on a substrate 16 and contact surface 14 on a substrate 18. Electrical connection 10 is produced by bonding in the known manner (ball-wedge bonding). To do this, a wire-bonding tool (not illustrated) is used to first heat the free end of a contact wire 20, forming it into a ball 21. A capillary nozzle of the wire-bonding tool is then used to press this ball 21 onto first contact surface 12, thus producing atomic bonding forces at the boundary between what is then a plastically deformed ball 21 and contact surface 12. The wire-bonding tool is then moved toward second contact surface 14, thus forming a loop 22 in contact wire 20. Contact wire 20 is pressed with the capillary nozzle onto second contact surface 14, where it is plastically deformed, thus producing atomic bonding forces between contact wire 20 and second contact surface 14. The plastic deformation of contact wire 20 (stitch) by the capillary nozzle simultaneously creates a rupture point at which contact wire 20 breaks after the capillary nozzle is removed. The design of second contact point 24 (wedge) has a relatively small contact area between contact wire 20 and contact surface 14. As a result, contact point 24 allows contact wire 20 to pull away from contact surface 14. Enormous contact problems arise, especially if contact surface 14 is made of a hard-to-bond material.

Electrical connection 10 illustrated in FIG. 1a is produced by a known bonding method (ball-wedge method). Such electrical connections 10 are established, for example, when microhybrid components are connected to microchips.

FIGS. 1b to 1h illustrate the method according to the present invention for establishing electrical connection 10, with this method being based on an electrical connection previously established according to FIG. 1a. In the following figures, identical components are always identified by the same reference numbers as in FIG. 1a and are not explained again.

Figure 1B:
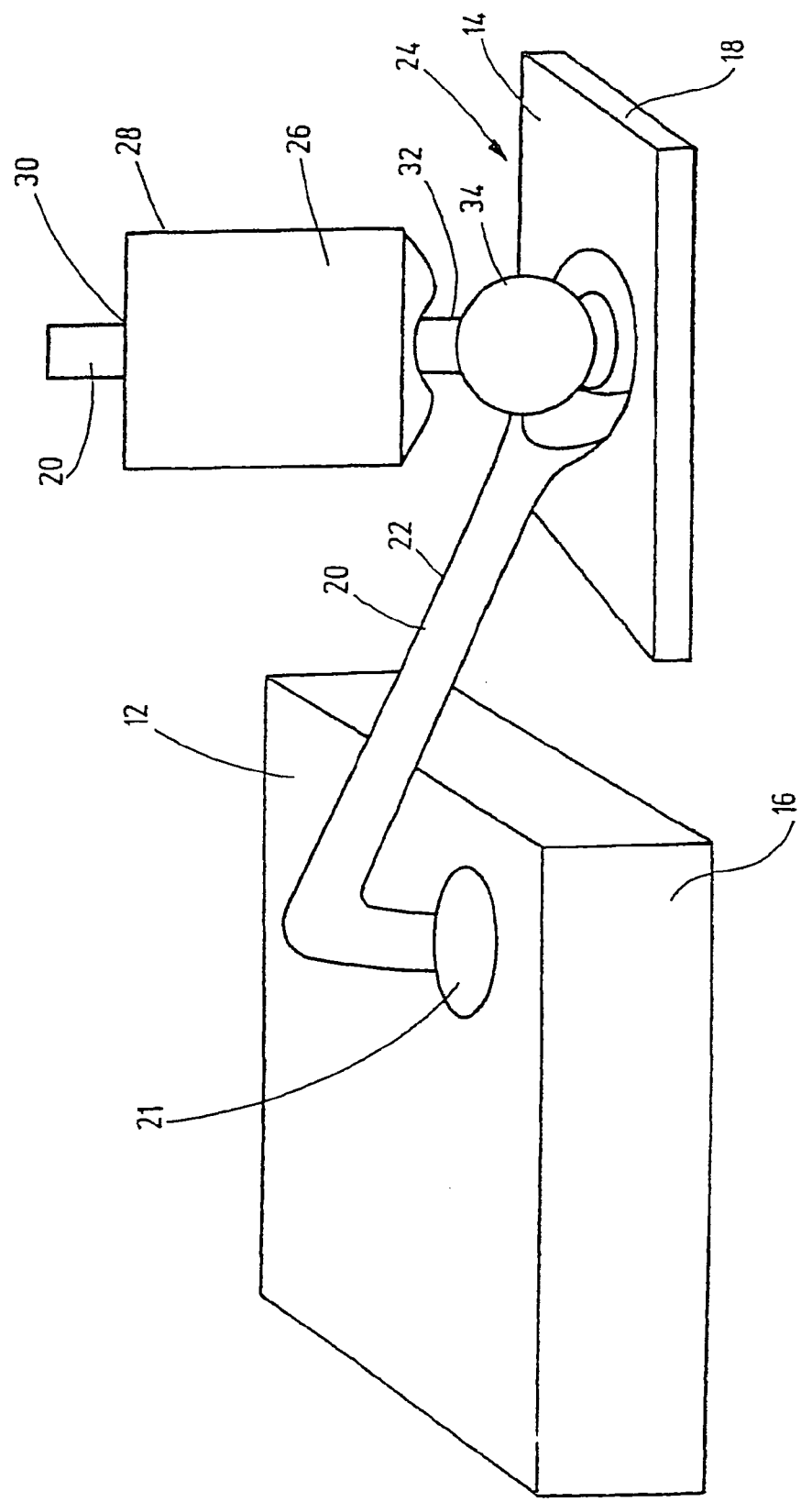
FIG. 1b shows a second schematic view of the process steps in establishing an electrical connection.

FIG. 1b shows a schematic representation of a capillary nozzle 26 of a wire-bonding tool 28. Capillary nozzle 26 has a passage 30 through which contact wire 20 is fed. Suitable feed devices enable contact wire 20 to move through capillary nozzle 26. After electrical connection 10 shown in FIG. 1a has been established, contact wire 20 moves toward second contact surface 14, and its free end 32 is heated to a temperature above its melting point, using a thermal energy source. A surface tension causes the molten mass of contact wire 20 to form a ball 34. Melting a ball 34 onto end 32 takes place directly after establishing the connection between contact wire 20 and contact surface 14, as shown in FIG. 1a. As a result, it is not necessary to reposition capillary nozzle 26 in relation to contact point 24.

Figure 1C:
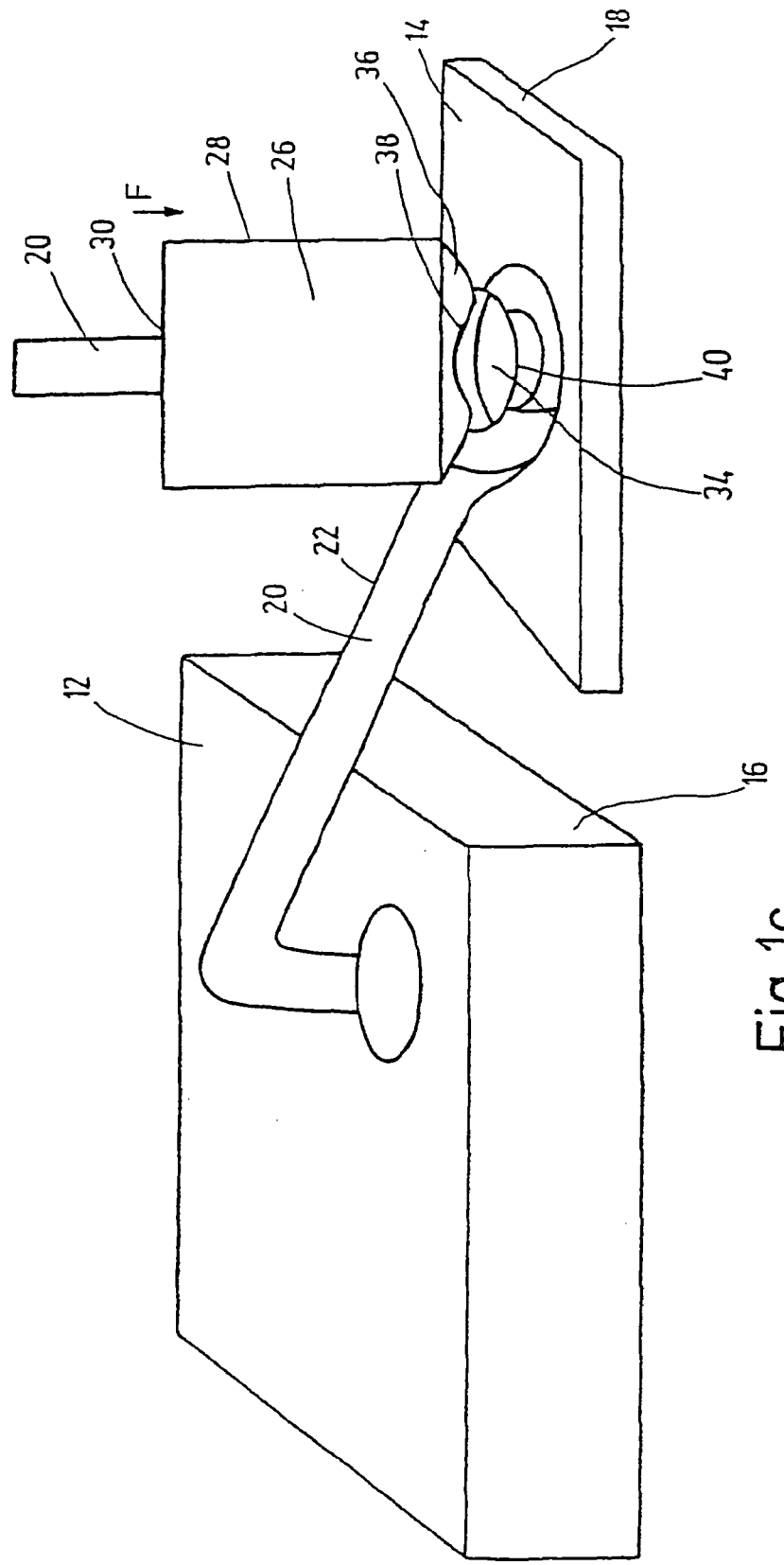
FIG. 1c shows a third schematic view of the process steps in establishing an electrical connection.

According to the next process step illustrated in FIG. 1c, a force and ultrasound are applied to capillary nozzle 26. This compresses ball 34, which undergoes plastic deformation. The shape of capillary nozzle 26 can influence the plastic deformation of ball 34. In the illustrated embodiment, the end of capillary nozzle 26 facing contact surface 14 has a circumferential ring-shaped ridge 36 that engages with an inner cone 38.

Figure 1D:
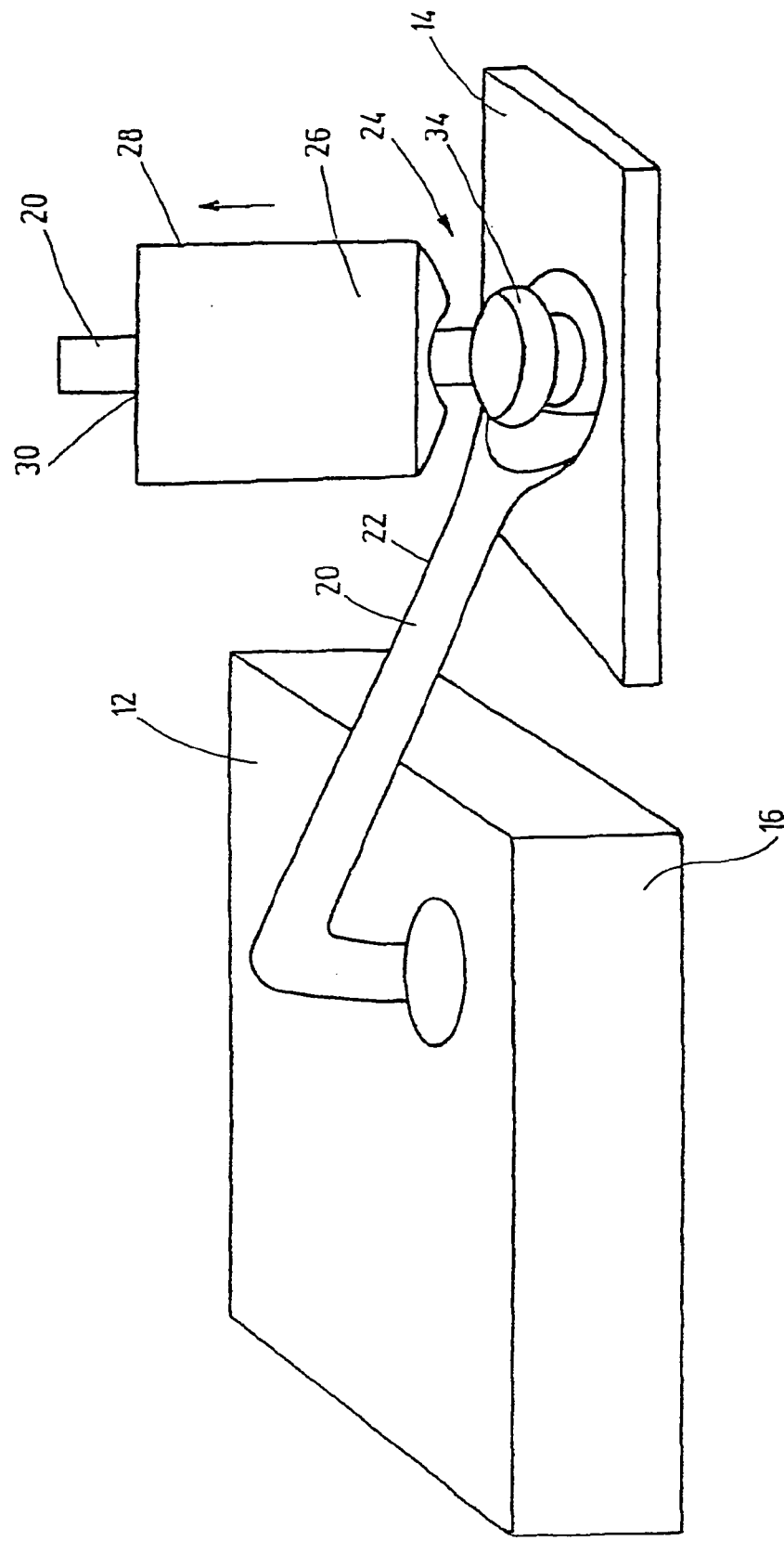
FIG. 1d shows a fourth schematic view of the process steps in establishing an electrical connection.

The plastic deformation of ball 34 follows the shape of this inner cone 38. The application of contact force F, combined with ultrasound energy, produces atomic bonding forces between ball 34 and, extending from center 40 of bonding point 24 to the wedge, causing deformed ball 34 adhere to contact point 24 during a motion away from contact surface 14, as shown in FIG. 1d.

Figure 1E:
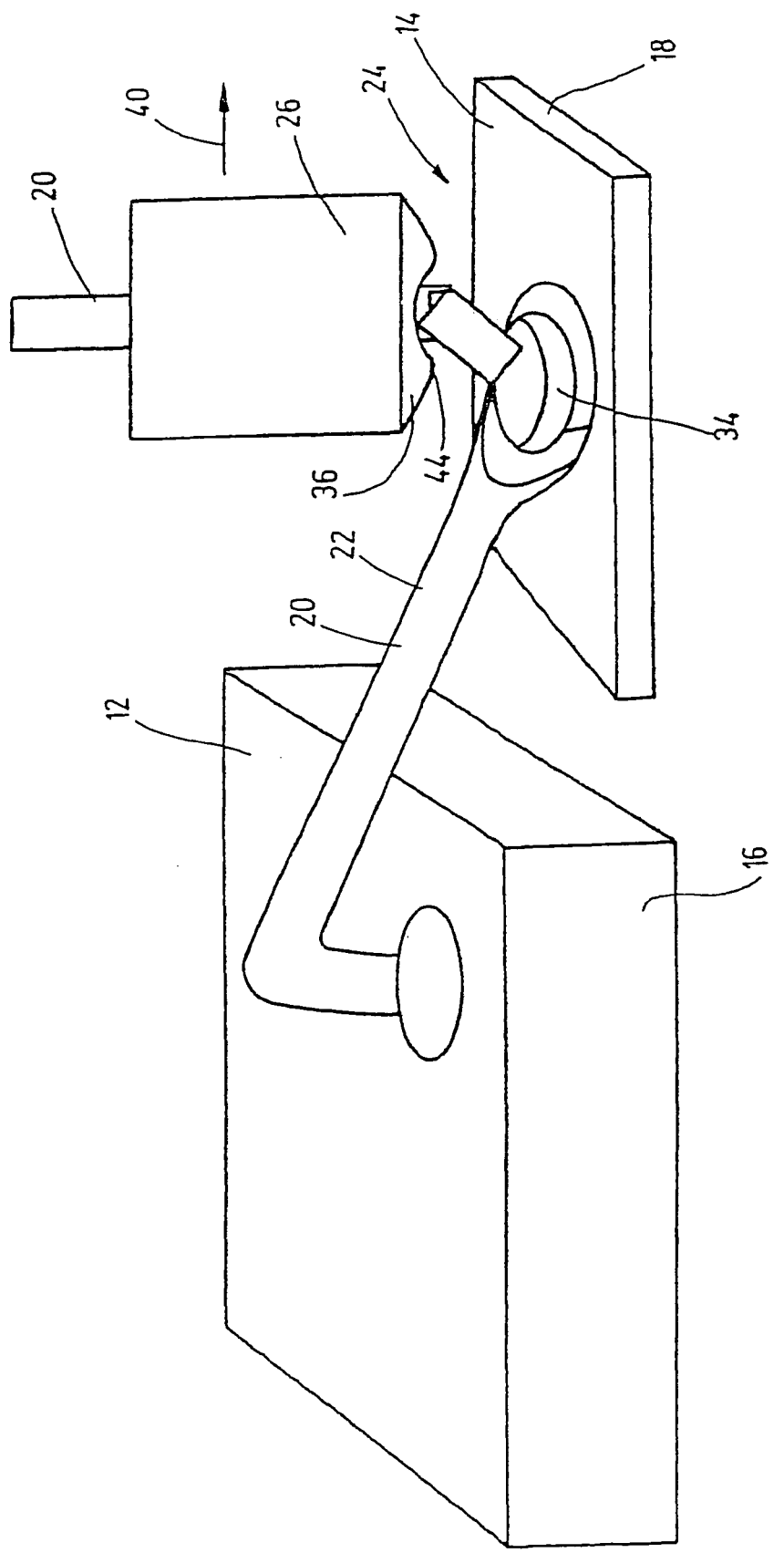
FIG. 1e shows a firth schematic view of the process steps in establishing an electrical connection.
Figure 1G:
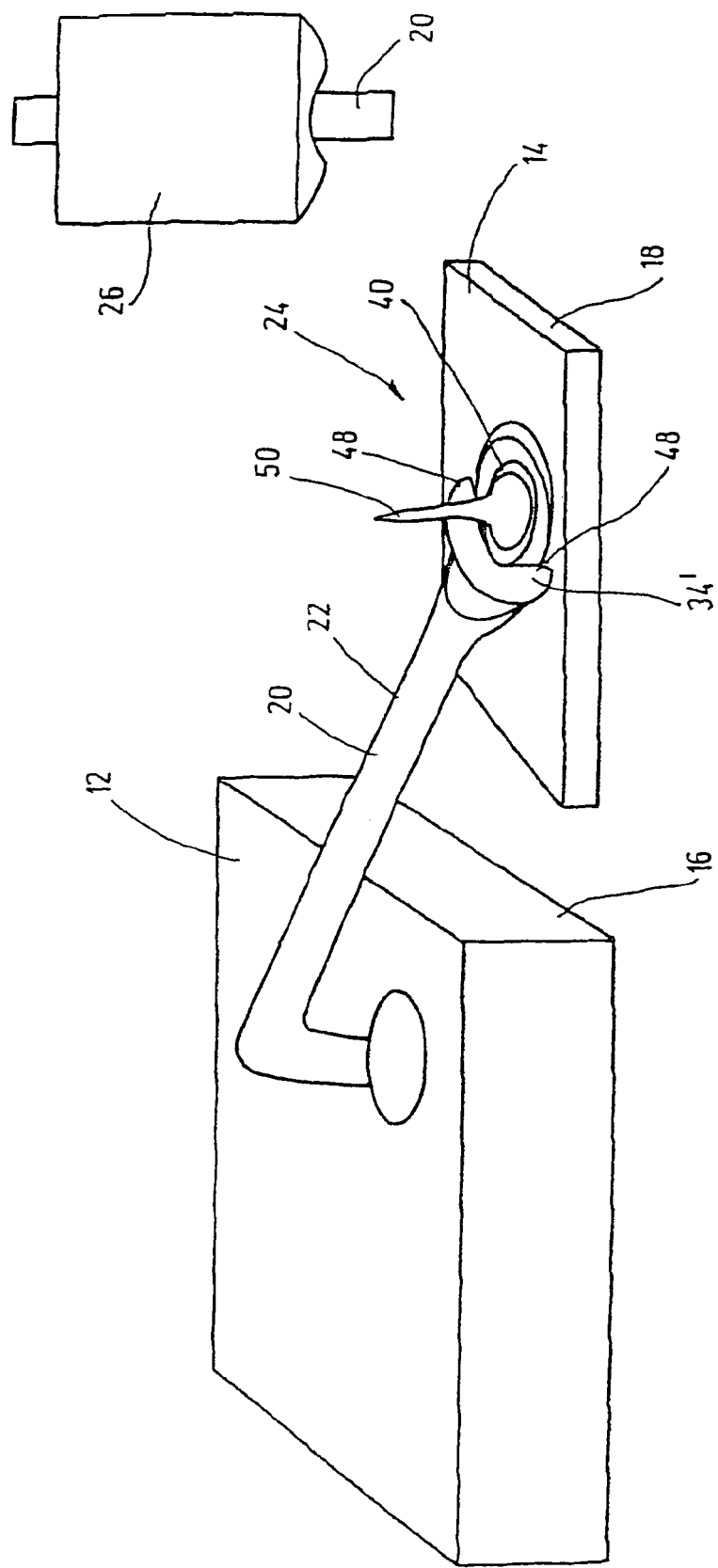
FIG. 1g shows a seventh schematic view of the process steps in establishing an electrical connection.

In a subsequent process step, illustrated in FIG. 1e, capillary nozzle 26 is moved laterally away from contact point 24. This movement is indicated by an arrow 40. If necessary, lateral movement 40 can be superimposed on the lifting of capillary nozzle 26 away from contact point 24 (FIG. 1d). Movement 40 is oriented so that its direction vector is more or less contrary to a longitudinal extension of contact wire 20 laid in loop 22. Direction of movement 40 is maintained until a vertex 44 of ring-shaped ridge 26 of capillary nozzle 26 has passed 10 an imaginary perpendicular running through deformed ball 34 (perpendicular that is parallel to the axis of capillary nozzle 26). As shown in FIG. 1f, capillary nozzle 26 is moved in the direction of contact surface 14 so that ring-shaped ridge 36 strikes plastically deformed ball 34. Depending on contact force F' applied, and under the influence of ultrasound, ball 34 undergoes a further plastic deformation, due to the outer lateral surface of ring-shaped ridge 36. Ball 34 undergoes a segment-like deformation. Ball 34 continues to change shape until segment 34' projects laterally over contact wire 20 already bonded to contact surface 14 and comes into physical contact with contact surface 14 in additional bonding areas 48. This type of deformation generates atomic bonding forces between segment 34' formed and contact surface 14, causes the segment to permanently adhere to the surface. After capillary nozzle 26 moves away, segment 34 spans contact wire 20 in the area of contact point 24 and holds the latter in place like a strap, as shown in FIG. 1g. Segment 34 provides a kind of tensile strain relief function to secure contact point 24 for contact wire 20. The remaining wire that broke away when capillary nozzle 26 was removed is visible in center 40 of contact point 24 in the form of a pointed elevation 50. The latter forms an additional positive-lock joint with contact wire 20 in the area of contact point 24.

Figure 1H:
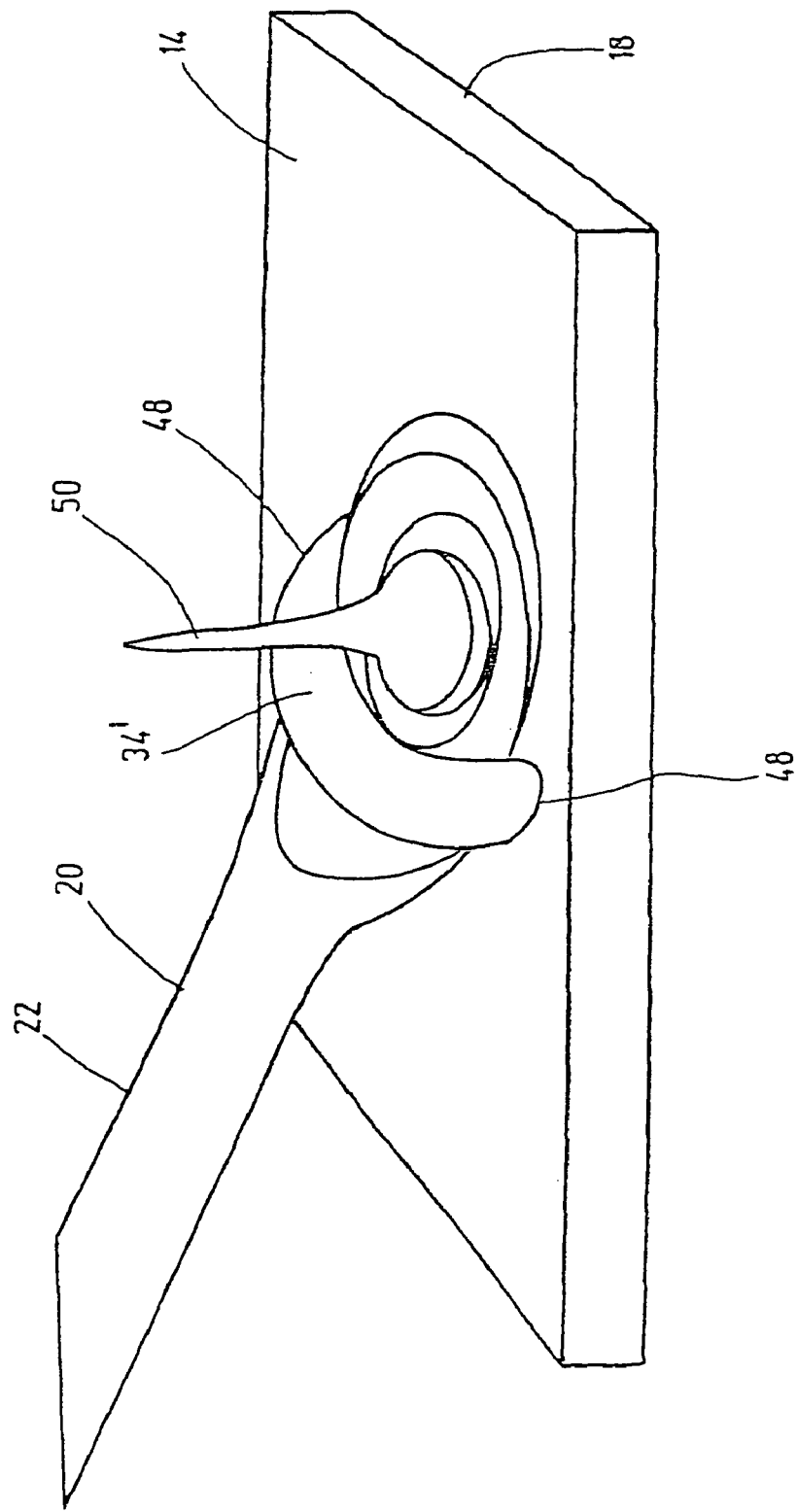
FIG. 1h shows a eighth schematic view of the process steps in establishing an electrical connection.

FIG. 1h shows an enlarged representation of contact point 24 after electrical connection 10 has been established with additional contact securing provided by segment 34'. It is clear that segment 34' has certain shape characteristics that are derived from the size of ball 34 (FIG. 1b), the size and type of bonding parameters (FIG. 1f), and the shape of ring-shaped ridge 36 of capillary nozzle 26. Because the shape of capillary nozzle 26, the magnitude of bonding forces, and the size of ball 34 are known or can be set, segments 34' can be achieved in reproducible shapes. After contact point 24 has been produced, segment 34' can be measured by an optical monitoring unit (not illustrated). Comparing the measured shape of segment 34' to a previously stored shape makes it possible to draw conclusions about the quality of contact point 24. If the shape of segment 34' matches the expected shape, a perfect, i.e., contact-secure and additionally secured contact point 24 can be assumed, making it possible to produce contact point 24 with zero errors. Fault-free usage values can thus be predicted, particularly when using electrical connections on microchips in safety/security systems.

The present invention is, of course, not limited to the embodiment illustrated in FIG. 1. In particular, different shapes can be selected for segment 34'. FIGS. 2 through 6 show different embodiments of segment 34'. The shape of segment 34' can be selected, for example, by choosing a different shape for capillary nozzle 26 and varying the placement of capillary nozzle 26 when shaping ball 34 into segment 34'. In addition, the design of segment 34, and the way it bonds to contact surface 14, can be influenced by setting general bonding parameters, such as force F or the frequency and intensity of the ultrasound energy.

According to further exemplary embodiments, it is possible, in particular, to provide a more shallow depression between tip 50 and segment 34'. This means that the transition between segment 34' and point 50 occurs through a relatively shallow depression, thereby improving the positive-lock joint between contact wire 20 and segment 34' or contact point 24 in the example.

Figure 2:
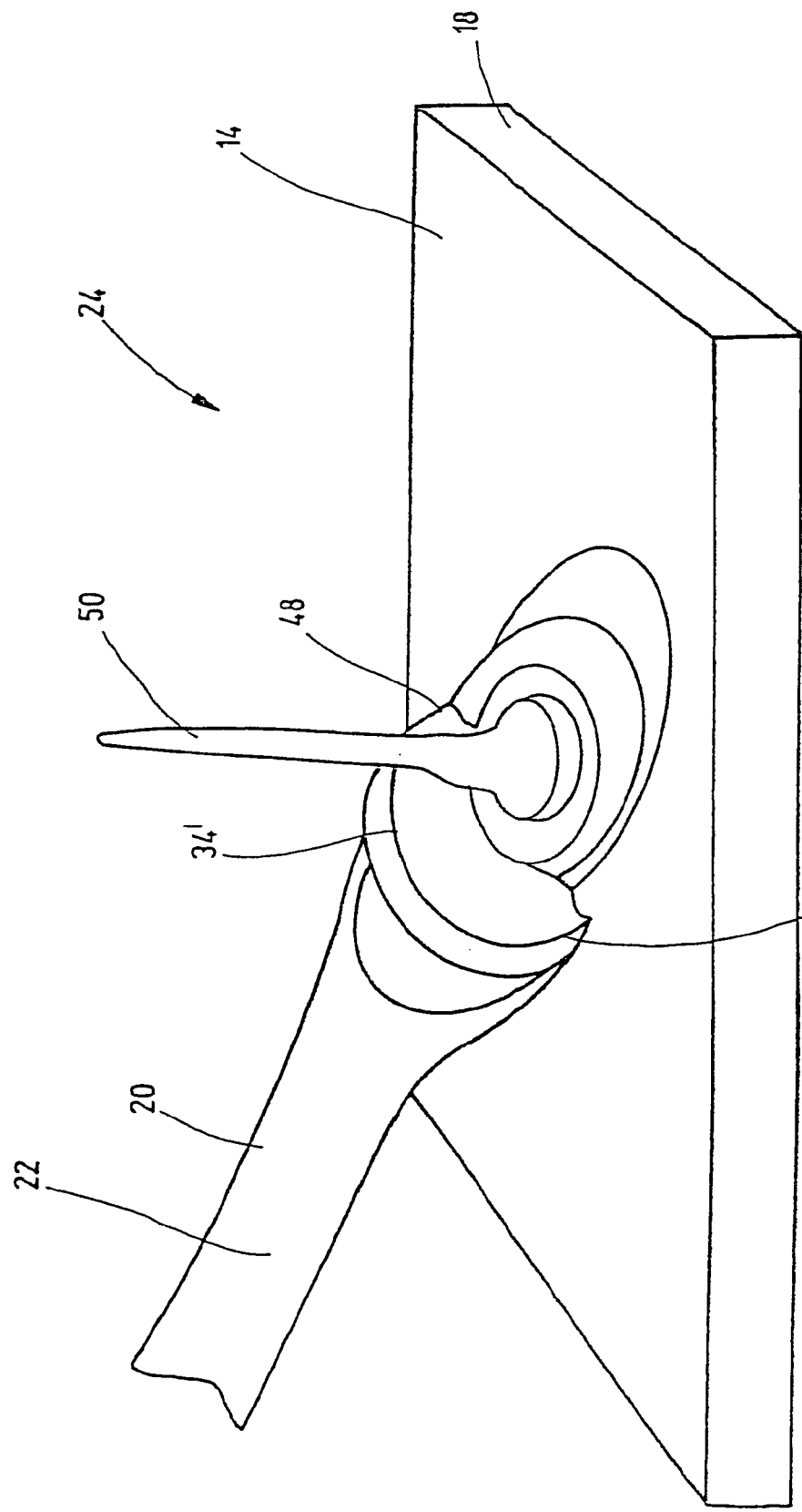
FIG. 2 shows a first embodiment of a contact point.

By way of example, FIG. 2 shows a segment 34' that is designed in the shape of a ridge. In contrast to this, segment 34' in FIG. 3 has a flatter design and merges with the material of tip 50. According to the embodiment illustrated in FIG. 4, segment 34' has an even flatter design, so that it is almost shaped like a disk and also merges with the material of tip 50. FIG. 5 shows a further embodiment, in which segment 34' is shaped like a shallow basin, with segment 34' again merging with the material of tip 50. Finally, FIG. 6 shows an embodiment of segment 34' in which segment 34' is designed as a largely flat disk that has a ridge-shaped bulge in the direction of contact wire 20. Tip 50, in this case, is formed from the material of segment 34' by deforming ball 34 accordingly. This can be achieved by a suitable design of capillary nozzle 26 and placement of capillary nozzle 26 while forming the ball into segment 34'.

It is also possible to modulate segment 34' as a largely rectangular object having a defined elongation in the x-direction, y-direction, and z-direction by setting the bonding parameters and/or placement parameters of capillary nozzle 26 while shaping segment 34'. Parameters that can be set while shaping ball 34 into "rectangular" segment 34' make it possible to set precisely reproducible dimensions in the x-, y-, and z-directions. A subsequent visual, in particular automatic visual, inspection of contact point 24 can be used to easily and effectively check contact point 24 for freedom from errors.

The invention claimed is:

1. A contact point for bonding a contact wire to a contact surface, with the contact wire merging with a material of the contact surface, comprising:
a first contact securing element forming a first bonding area within the contact surface;
an additional contact securing element that is directly attached to the first contact securing element, at least partially engages over the contact wire in an area of the contact point and forms at least one additional bonding area with the contact surface, wherein the additional contact securing element is coterminous with, and formed from the same material as, the first contact securing element; and
a positive lock joint located within a surface area of the additional contact securing element;
wherein the additional contact securing element includes a segment that engages with a stitch of the contact wire at the contact point and is positioned on one side of a center of the contact point in a direction of a loop of the contact wire, and
wherein the additional contact securing element includes a ridge-shaped structure substantially on one side and in the direction of the loop of the contact wire, and extending away from a center of the additional contact securing element.

2. The contact point as recited in claim 1, wherein the segment engages with both sides of the contact wire to form the at least one additional bonding area with the contact surface.

3. The contact point as recited in claim 1, wherein the segment has a rectangular shape with dimensions in the x-, y-, and z-directions that can be reproducibly set using a wire-bonding tool.

4. The contact point as recited in claim 1, wherein the lock joint forms an elevated tip extending away from the contact surface.

5. The contact point as recited in claim 1, wherein the additional contact securing element is substantially disk-shaped.

6. The contact point as recited in claim 1, wherein the additional contact securing element includes a concavity located between a ridge portion of the additional contact securing element and a pointed elevation portion of the additional contact securing element.

7. The contact point as recited in claim 1, wherein a peripheral portion of the additional contact securing element forms a ridge-shaped bulge extending towards an opposing end of the contact wire.

8. The contact point as recited in claim 1, wherein the additional contact securing element includes a segment that engages with a stitch of the contact wire at the contact point and is positioned on one side of a center of the contact point in a direction of a loop of the contact wire, and wherein the lock joint forms an elevated tip extending away from the contact surface.

9. The contact point as recited in claim 1, wherein the additional contact securing element includes a segment that engages with a stitch of the contact wire at the contact point and is positioned on one side of a center of the contact point in a direction of a loop of the contact wire, and wherein the additional contact securing element is substantially disk-shaped.

10. A contact point arrangement for bonding a contact wire to a contact surface, comprising:
a substantially flattened section of the contact wire, the flattened section adhering directly to the contact surface to form a stitch bond;
a ridge-shaped portion formed from an additional piece of wire material melded to the flattened section, the ridge-shaped portion projecting from the flattened section at an angle away from the contact surface; and
a pointed elevation formed from the additional piece of wire material, the pointed elevation being melded to, and projecting away from, a flat portion of the flattened section, wherein the ridge-shaped portion is substantially on one side and in the direction of a loop of the contact wire.

* * * * *